US007503021B2

(12) United States Patent
Boucher et al.

(10) Patent No.: US 7,503,021 B2
(45) Date of Patent: Mar. 10, 2009

(54) INTEGRATED CIRCUIT DIAGNOSING METHOD, SYSTEM, AND PROGRAM PRODUCT

(75) Inventors: Matt Boucher, Colchester, VT (US); John M. Cohn, Richmond, VT (US); Richard Dauphin, Shelburne, VT (US); Mark Masters, Essex Junction, VT (US); Judith H. McCullen, Essex Junction, VT (US); Sarah C. Braasch, Richmond, VT (US); Michael H. Sitko, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 222 days.

(21) Appl. No.: 11/160,266

(22) Filed: Jun. 16, 2005

(65) Prior Publication Data

US 2005/0278667 A1    Dec. 15, 2005

Related U.S. Application Data

(63) Continuation of application No. PCT/US02/40429, filed on Dec. 17, 2002.

(51) Int. Cl.
*G06F 17/50* (2006.01)
(52) U.S. Cl. .............................. 716/4; 716/5
(58) Field of Classification Search ...... 716/1, 716/4–5, 3, 17
See application file for complete search history.

(56) References Cited

U.S. PATENT DOCUMENTS

| 5,694,481 | A | 12/1997 | Lam et al. |
| 6,236,746 | B1 | 5/2001 | Chamberlain et al. |
| 6,289,116 | B1 | 9/2001 | Chamberlain et al. |
| 6,536,018 | B1 | 3/2003 | Chisholm et al. |
| 6,684,379 | B2 | 1/2004 | Skoll et al. |
| 6,738,957 | B2 | 5/2004 | Gont et al. |
| 6,782,524 | B2 * | 8/2004 | Rittman ................ 716/19 |
| 6,907,583 | B2 * | 6/2005 | Abt et al. ............... 716/1 |

OTHER PUBLICATIONS

Bourbakis et al., A Knowledge-Based Expert System for Automatic Visual VLSI Reverse-Engineering: VLSI Layout Version, IEEE Transactions on Systems, Man and Cybernetics, May 2002, vol. 32, No. 3, pp. 428-436.
Bourbakis et al., Specifications for the Development of An Expert Tool for the Automatic Optical Understanding of Electronic Circuits: VLSI Reverse Engineering, 1991 IEEE VLSI Test Symposium, Apr. 1991, pp. 98-103.

* cited by examiner

*Primary Examiner*—Vuthe Siek
(74) *Attorney, Agent, or Firm*—Lisa U. Jaklitsch

(57) ABSTRACT

The invention provides a method, system, and program product for diagnosing an integrated circuit. In particular, the invention captures one or more images for each relevant circuit layer of the integrated circuit. Based on the image(s), a component netlist is generated. Further, a logic netlist is generated by applying hierarchical composition rules to the component netlist. The component netlist and/or logic netlist can be compared to a reference netlist to diagnose the integrated circuit. The invention can further generate a schematic based on the component netlist or logic netlist in which components are arranged according to port, power, and/or component pin connection information determined from the netlist. Further, the schematic can be displayed in a manner that wiring connections are selectively displayed to assist a user in intelligently arranging the circuit components.

17 Claims, 5 Drawing Sheets

INTEGRATED CIRCUIT DIAGNOSING METHOD, SYSTEM, AND PROGRAM PRODUCT

CROSS REFERENCE TO RELATED PATENT APPLICATIONS

This application is a continuation of PCT Application No. PCT/US02/40429 filed on Dec. 17, 2002.

TECHNICAL FIELD

The invention generally relates to diagnosing an integrated circuit.

DESCRIPTION OF THE PRIOR ART

Frequently, it is desirable to reverse-engineer an integrated circuit into a netlist and/or a schematic in order to recover a lost netlist or schematic, determine if the integrated circuit violates intellectual property rights, or analyze performance or failure of the integrated circuit. A schematic is a visual representation of a circuit, while a netlist is a textual representation of all the elements and various pin connections of a circuit. Several properties of integrated circuits make the reverse-engineering process difficult and time consuming. For example, the physical placement of the various components on the integrated circuit may have no relation to where the components would be located in a schematic. Further, integrated circuits are often implemented in several layers that have been pieced together to establish the intended connectivity.

Recently, several solutions have been proposed to assist in the otherwise tedious reverse-engineering process. Generally, a scanning electron microscope (SEM) or similar imaging device is employed to examine the layers of the integrated circuit. Additional tools allow for the overlay of data on the images to discern component features and wiring interconnections. Alternatively, tools can transform the image into a layout.

However, continuing the reverse-engineering process to generate a netlist and/or a schematic continues to require specialized skill and remains time consuming. As a result, there exists a need for an integrated circuit diagnosing system, methods, and program product that increase the accuracy of a resulting netlist and/or schematic while reducing the amount of skill required to generate the netlist and/or schematic from the integrated circuit.

SUMMARY OF THE INVENTION

The invention provides methods, a system, and program product for diagnosing an integrated circuit. In particular, the invention captures one or more images for each relevant circuit layer of the integrated circuit. Based on the image(s), a component netlist is generated. Further, a logic netlist is generated by applying hierarchical composition rules to the component netlist. The component netlist or logic netlist can be compared to a reference netlist to diagnose the integrated circuit. The invention can further generate a schematic based on the component netlist or logic netlist in which components are arranged according to port, power, and/or component pin connection information determined from the netlist. Further, the schematic can be displayed in a manner that wiring connections are selectively displayed to assist a user in intelligently arranging the circuit components.

The illustrative aspects of the invention are designed to solve the problems herein described and other problems not discussed, which are discoverable by a skilled artisan.

BRIEF DESCRIPTION OF DRAWINGS

These and other features of this invention will be more readily understood from the following detailed description of the various embodiments of the invention taken in conjunction with the accompanying drawings in which.

Figure 1:
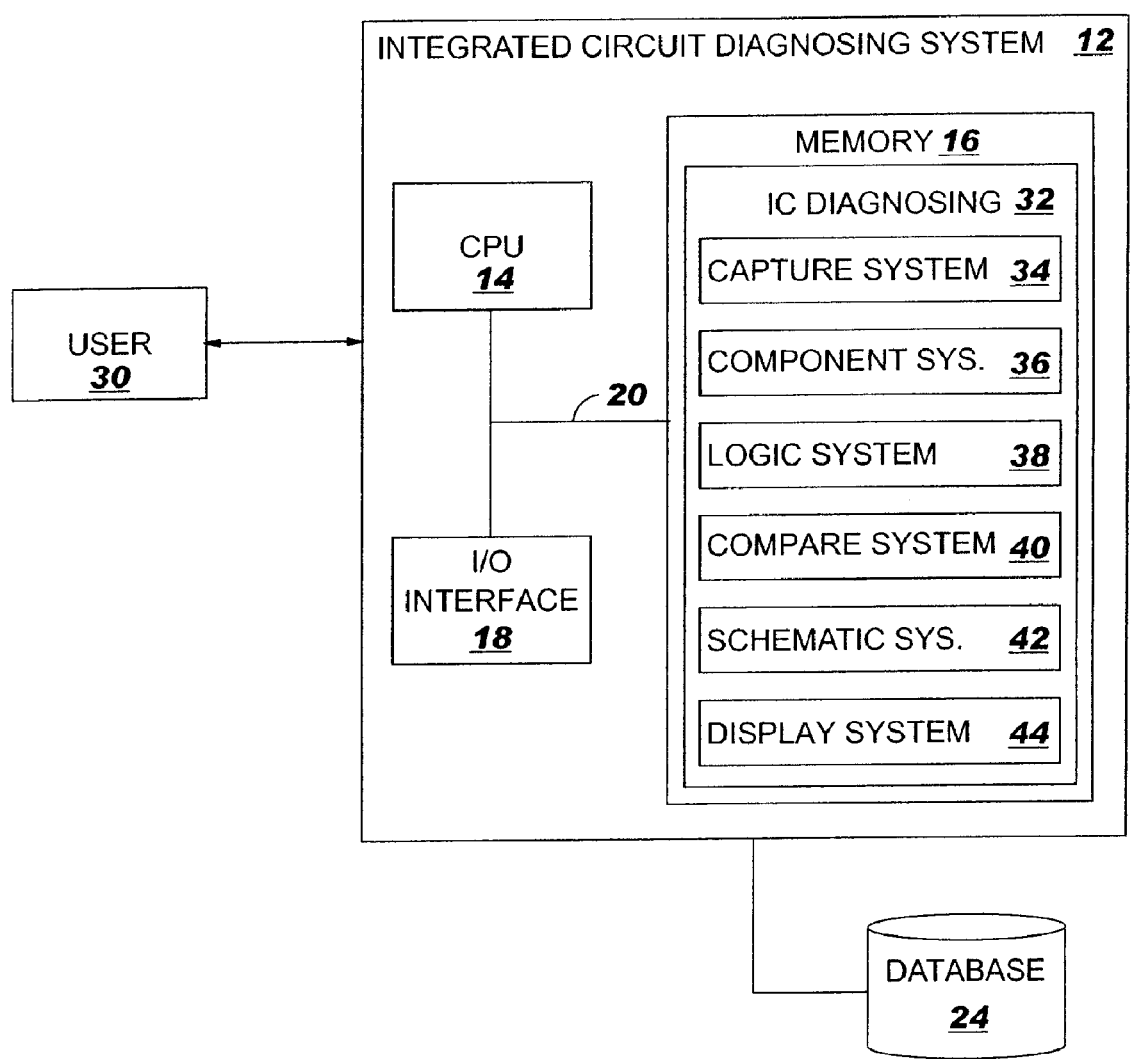
FIG. 1 depicts an illustrative system for implementing various embodiments of the invention.

It is noted that the drawings of the invention are not to scale. The drawings are intended to depict only typical embodiments of the invention, and therefore should not be considered as limiting the scope of the invention. In the drawings, like numbering represents like elements between the drawings.

DESCRIPTION OF THE PREFERRED EMBODIMENT

For convenience purposes only, the detailed description includes sections denoted by headings, including I. ILLUSTRATIVE SYSTEM; II. METHOD OVERVIEW; III. CAPTURING IMAGE(S); IV. COMPONENT NETLIST GENERATION; V. LOGIC NETLIST GENERATION; VI. NETLIST APPLICATIONS; and VII. ALTERNATIVES.

The invention provides a system, program product and methods of diagnosing an integrated circuit ("IC"). The invention generates a "component netlist" and/or a "logic netlist" based on one or more images of each circuit layer of the integrated circuit. A "component netlist" includes circuit components used in the integrated circuit (i.e., transistors, capacitors, resistors, ports, power rails, resistors, diodes, chips, etc.) and their interconnections. A "logic netlist" comprises a list in which one or more collections of circuit components in the component netlist are replaced with one or more symbols representing the function(s) implemented by each collection of circuit components (i.e., AND gate, NAND operation, Adder, etc.).

I. Illustrative System

FIG. 1 depicts an integrated circuit diagnosing system 12 according to one embodiment of the invention. System 12 may include a central processing unit (CPU) 14, memory 16, input/output (I/O) interface 18, bus 20 and an optional database 24. As shown, a user 30 interacts with system 12 via I/O interface 18. System 12 may be any type of general purpose/specific-use computerized system (e.g., a server, a desktop computer, etc.). User 30 may be an individual using system 12 or may include any type of computerized system (e.g., a mobile phone, a handheld computer, a personal digital assistant, a portable (laptop) computer, a desktop computer, a workstation, a mainframe computer, etc.) that can be used to access system 12, for example, by a network. In the latter case, communications between user 30 and system 12 may be any now known or later developed mechanisms for such purposes, e.g., one or more direct hardwired connections (e.g., serial port), or via an addressable connection in a client-server (or server-server) environment which may utilize any combination of wireline and/or wireless transmission methods. In a client-server environment, the server and client may be connected via the Internet, a wide area network (WAN), a local area network (LAN), a virtual private network (VPN), or other private network. The server and client may utilize conventional network connectivity, such as Token Ring, Ethernet, WiFi or other conventional communications standards. Where the client communicates with the server via the Internet, connectivity could be provided by conventional TCP/IP sockets-based protocol. In this instance, the client would utilize an Internet service provider to establish connectivity to the server.

System 12 can comprise any general purpose or specific-use system utilizing standard operating system software, which is designed to drive the operation of the particular hardware and which is compatible with other system components and I/O controllers. CPU 14 may comprise a single processing unit, multiple processing units capable of parallel operation, or be distributed across one or more processing units in one or more locations, e.g., on a client and server. Memory 16 may comprise any known type of data storage and/or transmission media, including magnetic media, optical media, random access memory (RAM), read-only memory (ROM), a data cache, a data object, etc. Moreover, similar to CPU 14, memory 16 may reside at a single physical location, comprising one or more types of data storage, or be distributed across a plurality of physical systems in various forms.

I/O interface 18 may comprise any system for exchanging information with user 30 including, for example, an I/O port (serial, parallel, ethernet, keyboard, mouse, etc.), a universal serial bus (USB) port, expansion bus, integrated drive electronics (IDE), a network system, a modem, speakers, a monitor (cathode-ray tube (CRT), liquid-crystal display (LCD), etc.), hand-held device, keyboard, mouse, voice recognition system, speech output system, scanner, printer, facsimile, pager, storage devices, etc. Bus 20 provides a communication link between each of the components in computer system 12 and likewise may comprise any known type of transmission link, including electrical, optical, wireless, etc. In addition, although not shown, additional components, such as cache memory, communication systems, system software, etc., may be incorporated into system 12.

Database 24 may provide storage for information necessary to carry out the invention as described below. As such, database 24 may include one or more storage devices, such as a magnetic disk drive or an optical disk drive. Further, database 24 can include data distributed across, for example, a LAN, WAN or a storage area network (SAN) (not shown). Database 24 may also be configured in such a way that one of ordinary skill in the art may interpret it to include one or more storage devices.

System 12 includes integrated circuit diagnosing program 32 stored in memory 16 as computer program code. Integrated circuit diagnosing program 32 implements the various methods discussed further below. Capture system 34 captures one or more images of an integrated circuit and can assign coordinate information to each image. Component system 36 generates a component netlist based on the one or more captured images. Logic system 38 generates a logic netlist based on the component netlist (described further below). Integrated circuit diagnosing program 32 is also shown including: a compare system 40 that compares a logic and/or component netlist with one or more reference logic and/or component netlists (collectively referred to as "reference netlists") generated from a reference circuit, a schematic system 42 that generates a schematic based on the logic and/or component netlist, and a display system 44 that selectively displays wiring information in a schematic.

It is understood that the various systems shown in integrated circuit diagnosing program 32 are included for illustrative purposes only. As a result, one or more of the systems may be combined into a single system or not be implemented. Further, one or more of the systems can be implemented as a distinct program that can be executed separately from integrated circuit diagnosing program 32.

II. Method Overview

Figure 2:
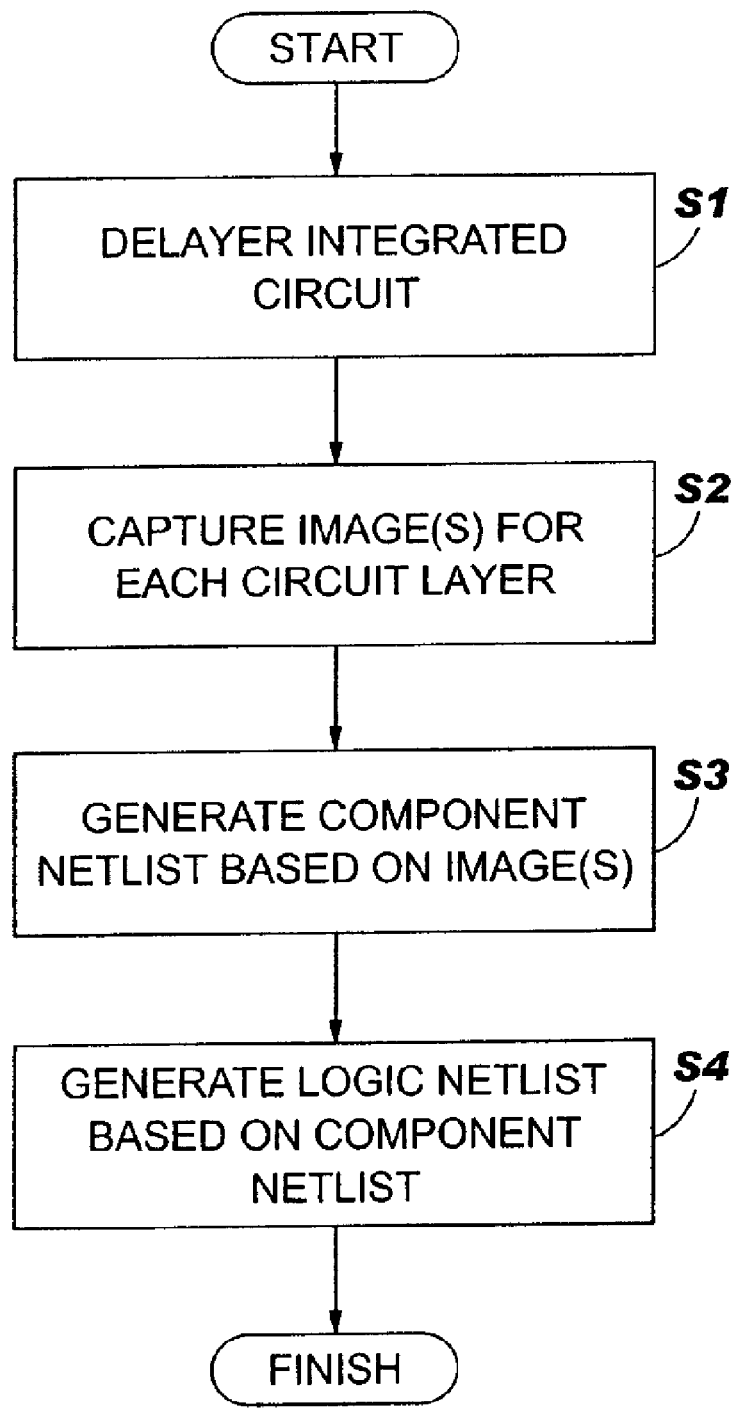
FIG. 2 depicts a method according to one embodiment of the invention.

FIG. 2 depicts an illustrative method of diagnosing an integrated circuit according to one embodiment of the invention. Integrated circuits include at least one layer, and generally include more than one layer which are relevant in performing a diagnosis. In step S1, when more than one circuit layer is relevant, each relevant circuit layer of the integrated circuit is delayered (i.e., exposed) using any technique now known or later developed. In step S2, one or more images of each circuit layer is captured as discussed in more detail below by capture system 34 (FIG. 1). In step S3, a component netlist is generated from the image(s). The invention provides two alternatives for generating the component netlist from the images using component system 36 (FIG. 1) that are discussed in more detail below. Using one alternative, the image(s) are transformed to a layout from which information for the component netlist is extracted. Alternatively, the information for the component netlist may be obtained directly from an inspection of the images. In step S4, a logic netlist is generated based on the component netlist by logic system 38 (FIG. 1). The logic netlist is generated by applying hierarchical composition rules to the component netlist to replace one or more circuit elements with the one or more logic functions that they implement.

As alluded to above, an integrated circuit can include circuit elements that make up one or more input and/or output "ports" (signals). A "port" is any type of circuitry that provides an interface to additional circuitry (i.e., a pad, a wire connected to a non-analyzed portion of the circuit, etc). Integrated circuits also often include one or more circuit elements that are connected to an internal power source ($V_{dd}$), ground ($V_{ss}$), or other power source. The invention provides for the inclusion of port and power information in the netlists.

The component netlist or logic netlist can be used in various applications. For example, the logic netlist or component netlist can be compared using compare system 40 (FIG. 1) to a comparable reference netlist based on a reference circuit. A logic netlist can be compared with another logic netlist (i.e., a "reference logic netlist") based on a reference circuit. Similarly, the component netlist generated from the integrated circuit can be compared to a component netlist (i.e., a "reference component netlist") used to create the integrated circuit to determine if an error in manufacturing occurred. Similarities and differences between the two circuits (netlists) can be determined and displayed by display system 44 (FIG. 1). Further, a schematic can be created using schematic system 42 (FIG. 1) in which circuit components are arranged based on port information, power information, and/or component pin connection information. For example, input port circuit elements can be located on the left of a schematic, output port circuit elements can be located on the right, $V_{dd}$ can be located on the top, and $V_{ss}$ can be located on the bottom. Wiring in the schematic can be selectively displayed using display system 44 (FIG. 1) to assist a user in further arranging the circuit components.

III. Capturing Image(s)

According to step S2, one or more images of each relevant circuit layer are captured and can be stored in memory, e.g., database 24 (FIG. 1). It is understood that the number of images required for each layer depends on the required circuit resolution, the size of the circuit layer, etc. Any means for capturing images can be used including, for example, a scanning electron microscope (SEM), a specialized electron beam tool (such as electron beam induced current (EBIC) techniques), optical microscopy, digital imaging, etc. When multiple images for each circuit layer are used, a coordinate system can be used to locate the images. For example, the upper left corner of each image can be assigned a coordinate value. The image that includes the upper left corner of the circuit layer would have a coordinate reference of (0, 0). Coordinates can be determined for example, based on the number of pixels present in the image and/or the physical area encompassed in the image, etc.

Images can be captured so that an image partially overlaps one or more adjacent images. An overlap helps ensure that the images obtain complete coverage of the circuit layer, and assists in identifying situations when a circuit element is found in two adjacent images. When overlap is present, the assigned coordinate reference of the images should account for the overlap. For example, when the coordinates are based on a number of pixels, the number of pixels that overlap should be subtracted from the total pixels to obtain the coordinate reference of an offset image. Alternatively, when sufficient accuracy in locating the images can be obtained, images can be captured so that no overlap is present.

IV. Component Netlist Generation

In step S3, a component netlist is generated based on the image(s) of the integrated circuit. As briefly outlined above, two alternatives can be chosen to generate the component netlist. The first alternative provides several improvements to existing technology in order to generate a component netlist, while the second alternative provides a more direct approach.

A. Layout-Based Generation

Figure 3:
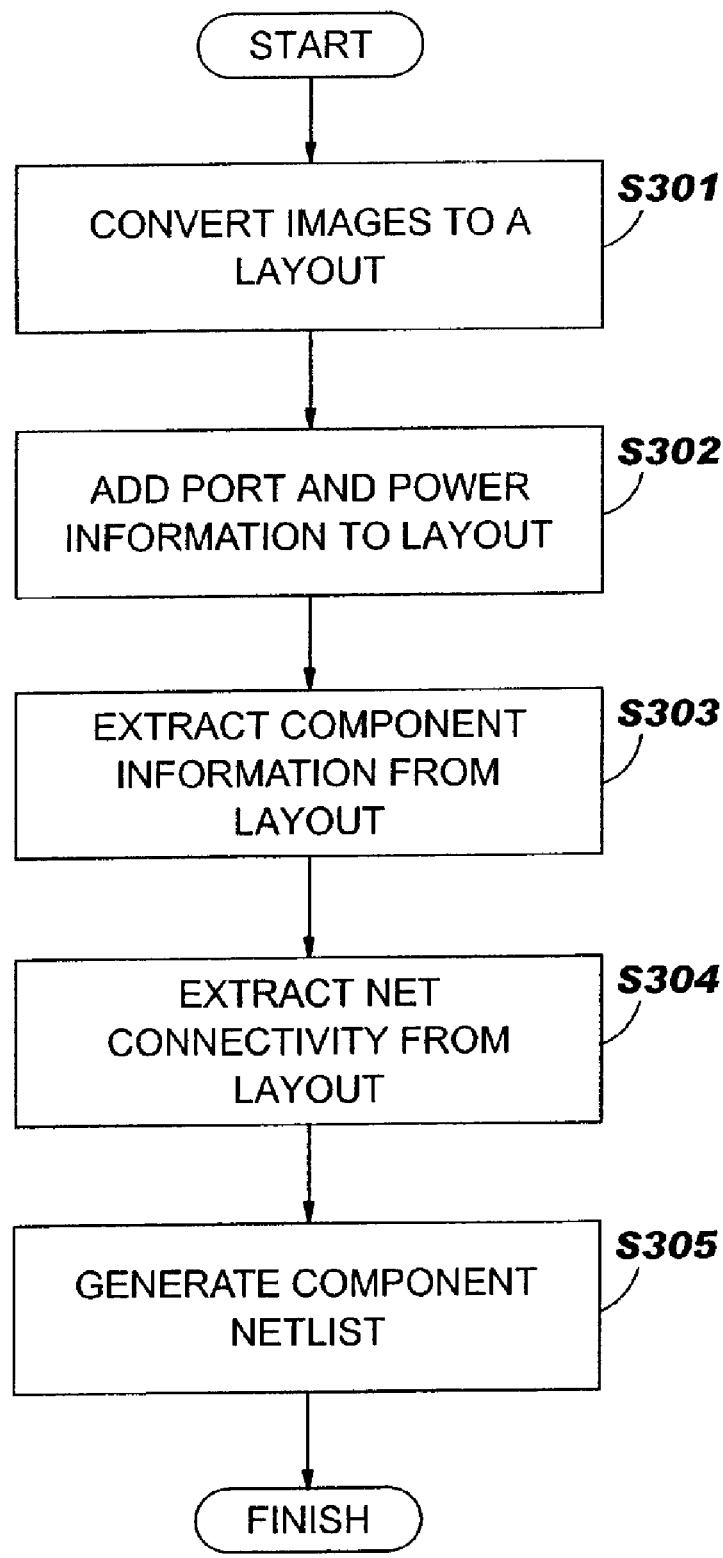
FIG. 3 depicts an illustrative method of generating a netlist according to another embodiment of the invention.

FIG. 3 depicts an illustrative method of generating a component netlist. In step S301, the image(s) of the integrated circuit are converted into a layout by component system 36 (FIG. 1). In this case, component system 36 (FIG. 1) may include software such as CHIPSCANNER™ by Raith USA Inc. to convert the image(s) into a layout. The layout is an electronic representation of the physical design of the integrated circuit. Common layout description file formats include GL1 and GDS. A layout can be read to present a visual depiction of each circuit element at its particular location within the integrated circuit.

Frequently, while the layout generated from the image(s) includes wiring and physical layout information, it lacks other information. For example, port(s) and power rail(s) definitions of the integrated circuit are frequently missing. Other information, such as wells, differentiating nominal-Vt transistors and low-Vt transistors, etc. may also be lacking. As a result, the layout may be edited using component system 36 (FIG. 1) to include definitions of some or all of the missing information. For example, differences in the threshold voltages between devices are typically marked with implant masks. The implant masks could be included in the layout data as a new level. In particular, as shown in step S302, port and power information may be added to the layout. This information assists in generating a schematic using the component netlist, comparing the component netlist with another component netlist, and/or converting the component netlist to a logic netlist, each of which is discussed further below.

In step S303, component information (transistors, resistors, chips, ports, power rails, etc.) is extracted from the layout. In step S304, the net connectivity (i.e., wiring information such as pin-to-pin connections) is extracted from the layout. In step S305, the component information and net connectivity are used to generate a component netlist.

An extraction engine can be provided as part of component system 36 (FIG. 1) to implement steps S303, S304, and S305. The extraction engine can be built from one or more tools that generate a layout from a component netlist. These tools can be modified to extract a component netlist from a layout. For example, ERIE™ by International Business Machines, is an example of a layout generation tool that can be modified to perform the functions of an extraction engine. In this case, ERIE is modified to accept data that defines layer interactions. Using the data, component information and net connectivity are extracted. The extracted information is then combined and formatted into a textual representation of the layout components and their connections (i.e., a component netlist).

While the layout-based approach outlined above beneficially uses existing technology with several improvements, this approach may not be preferred in certain instances. For example, when a smaller integrated circuit is being diagnosed, a more "hands on" approach may be desired. Further, errors in one or more of the steps outlined above may be more difficult to determine versus a more direct approach. As a result, the image-based approach outlined below may be advantageous in certain cases.

B. Image-Based Generation

Figure 4:
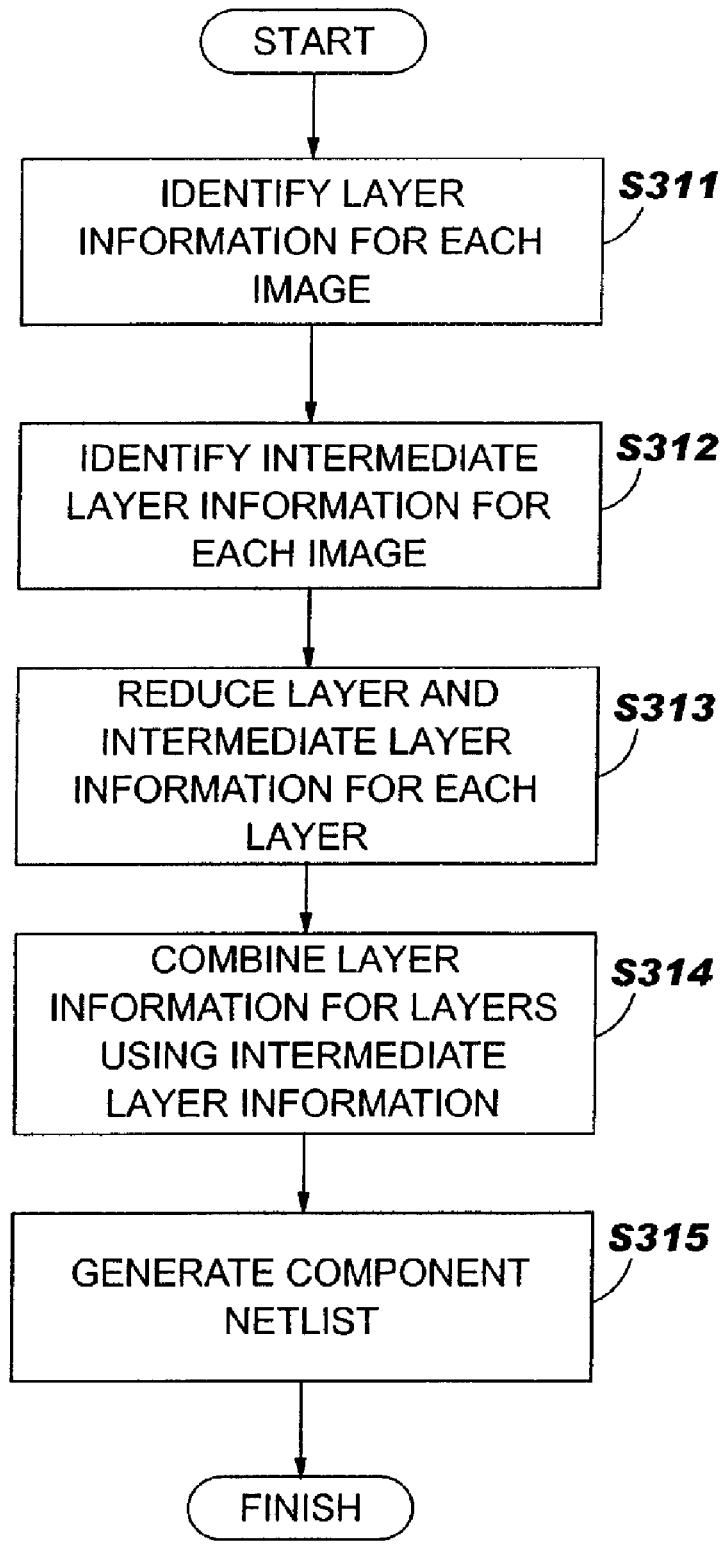
FIG. 4 depicts an alternative method of generating a netlist according to yet another embodiment of the invention.

FIG. 4 depicts an alternative method of generating a component netlist based on one or more circuit images. In step S311, "layer information" is identified for each image. "Layer information" may include circuit elements that are relevant to diagnosing the integrated circuit, including the ports, circuit components, component pins, wires, and power rails (collectively referred to as "circuit elements"). Identifying the layer information can be performed by a computer program (i.e., part of component system 36 (FIG. 1) capable of identifying and distinguishing the various circuit elements in an image, and/or by a user identifying the various circuit elements.

With regard to user identification, a user can be presented with each circuit image in turn. While viewing a circuit image, the user can identify a circuit element. The user could then define an area by outlining a region over the circuit element in the image using an interface of component system 36 (FIG. 1). Once the region is defined, it is given a unique identifier, and tagged with the type of circuit element. The element characteristics (i.e., identifier, level, type, location, and area information) are stored in a database. This process can continue until all relevant circuit elements have been identified.

Ports can be identified and stored for the circuit layer that best represents the external interface to the circuit, and the various components (i.e., transistor, resistor, etc.) can be identified and stored either manually or using software. Subsequently, for each component, pins can be identified and stored along with information such as the type of pin (i.e., for a field effect transistor, source, drain or gate). Finally, the wiring can be identified and stored.

Alternatively, a collection of pins can be used to identify a component without separately identifying the component. Further, a group of elements can be identified as a single element. For example, a group of vias or wires that carry the same signal can be identified as a single component. As discussed above, an image offset may be added to the location on the image when multiple images are used for a circuit layer. The region can remain displayed over the image to assist the user in remembering that the element has been identified. This process can be repeated for each desired circuit element, and each image until all relevant circuit elements within all relevant images have been identified.

In step S312, to facilitate determining connections between circuit layers, circuit elements that provide connections between two or more layers can be identified and stored as intermediate layer information either manually or using software. "Intermediate layer information" includes identification of all circuit elements that provide connectivity between layers, including vias and contacts. Similar to step S311, a computer program part of component system 36 (FIG. 1) and/or a user can define the shape characteristics that represent an intermediate circuit element that are then stored in database 24 (FIG. 1) as intermediate layer information. The intermediate layer information further identifies the two layers between which the circuit element is located (i.e., layer 2 and layer 3). Alternatively, intermediate layer information can be defined and stored as layer information, and distinguished by the type of circuit element being identified (i.e., via, contact, etc.).

In step S313, the layer information and intermediate layer information are individually reduced after being identified either manually or using software. To reduce layer information, the circuit elements are combined into net groups. A "net group" comprises a set of circuit elements that are determined to overlap. As a result, each net group indicates a collection of circuit elements that have electrical continuity. Initially, the location and region characteristics for the circuit elements are compared using component system 36 (FIG. 1) to determine if there is any overlap with a circuit element of the same type (i.e., pin/pin, wire/wire, etc.) or of a connecting type (i.e., wire/pin, wire/port, etc.). Overlap occurs for example, when a circuit element continues across two images, when ends of two elements of the same type abut (i.e., adjacent images with no overlapping data), or when the two circuit elements share the same two-dimensional space (i.e., wire connected to a pin). When overlap is found, the two circuit elements are associated with a net group that is identified by a unique net identifier. When neither circuit element belongs to a net group, a new net group is created. If one element is already associated with a net group, the second element is added to the net group. Should both elements belong to distinct net groups, the two net groups are combined into a single net group. Intermediate layer information is reduced in the same manner.

Because of potential errors in the definition of the regions and the coordinate assignment of each circuit element, a variance can be used to determine whether an overlap is present. A "variance" is an area added to a defined region to account for potential errors. For example, a variance equal to or less than one half the groundrule pitch for the circuit level can be added to a region before determining if it overlaps with one or more other regions. For an integrated circuit having 0.5 micron minimum line widths, a variance less than or equal to 0.25 microns can be used. The groundrule pitch may be specified by a user in a particular measurement unit (i.e., microns) and converted to coordinates (i.e., pixels) based on the image resolution used to image the circuit layer.

In step S314, the layer information for adjacent layers is combined using the intermediate layer information either manually or using software. A similar method as used with the layer information can be incorporated to determine overlapping elements between layers (i.e., adding a variance and comparing regions). However only particular circuit elements are searched for overlaps. In this case, when a match is found, the two net groups are combined into a single net group. The process is continued until all layers have been processed. For example, to combine the information for a layer 1 and a layer 2, the intermediate layer information obtained from the two layers can be sequentially selected and analyzed. As discussed above, a via may be stored as an intermediate circuit element and selected for analysis. A variance can be added to the defined shape of the via. The modified shape is compared to the layer information of layer 1 and then layer 2. The location of a wire on layer 1 connected to the via would at least partially overlap with the modified shape. As a result, the via is added to the net group for the wire on layer 1. A similar wire may be found on layer 2. In this case, the net groups for the layer 2 wire and layer 1 wire are combined and stored as a single net group.

After the reduction and combination steps, each net group represents a complete wiring combination. In other words, each net group should include connections from a component pin, port, and/or power rail to at least one other component pin, port, and/or power rail. As a result, in step S315, the net groups can be used to generate a component netlist either manually or using software. Each net group is selected and all of the wiring connections defined by the net group are added to a component netlist. Once all net groups have been processed, a complete component netlist has been generated.

V. Logic Netlist Generation

Returning to FIG. 2, step S4 includes generating a logic netlist based on the component netlist using logic system 38 (FIG. 1). In one embodiment, hierarchical composition rules are applied to the component netlist to replace one or more circuit elements with an equivalent logical component. A "hierarchical composition rule" defines a logical component based on one or more circuit components and their connectivity. Inclusion of the port and power information allows the hierarchical composition rules to use the component function and net connectivity of the various component pins that are included in the component netlist to determine the function of portions of the circuit. For example, two transistors can be connected to implement a logical NOT of an input port. Typically, a pin of one transistor is tied to $V_{dd}$ while a pin of the other transistor is tied to $V_{ss}$. To determine the logical equivalent, a hierarchical composition rule is applied that recognizes the function of each transistor and the connections of the various pins of each transistor. Since power information is incorporated into the component netlist, the appropriate pin connections can be determined. The input port can be selected and the various connections to component pins traced. Once a circuit implementing a logical NOT is found, the two transistors are replaced by a NOT gate. Because some logical circuits may include one or more simpler logical components in the circuitry, the process can continue until the most complex logical component is selected to replace portions of the component netlist.

A database that includes common component netlist information for various logical components can be used to determine elements that implement a logical component in the circuit. Alternatively, the pin states can be dynamically analyzed to determine a logical component implemented in the circuitry. Several passes can be performed in which combinations of basic logical components are combined into a single, more complex logic component (i.e., an Adder can replace several logical components).

VI. Netlist Applications

Many applications for diagnosing the integrated circuit using the component netlist and/or logic netlist are possible. The invention optionally provides one or more unique capabilities to some of these applications, which are discussed below.

A. Netlist Comparison

The component netlist or the logic netlist can be compared by compare system 40 (FIG. 1) to one or more reference netlists based on a reference circuit to determine similarities/differences between the integrated circuit and a reference circuit. An example of when this may be desired is when an integrated circuit does not function as expected. A component netlist can be generated from the integrated circuit and compared to a reference component netlist (i.e., the component netlist used to create the integrated circuit). Any difference between the two circuits would potentially indicate an error in manufacturing the integrated circuit.

Alternatively, the logic netlist can be compared to one or more reference logic netlists to determine whether the two circuits are similar. This may be useful, for example, to determine whether intellectual property held in at least a portion of an integrated circuit has been violated. The reference logic netlist(s) can be based on a reference circuit for which patent protection has been obtained. The logic netlist can be compared with the reference logic netlist to determine whether there is any similarity between the reference circuit(s) and the integrated circuit. For example, the logic netlist can be compared to a reference logic netlist by selecting a common input/output port and following the circuit paths. A threshold similarity can be specified after which a match is detected. Portions of the circuits that match can be displayed by a name provided for the reference logic netlist, by displaying the netlist entries, and/or by displaying a schematic based on the matched circuits.

B. Schematic Generation

Frequently, a schematic based on the component netlist and/or the logic netlist is desired. A problem with generating a schematic from an integrated circuit is that the circuit components are placed in such a manner that the connections create a nearly incomprehensible web of crossing lines. As a result, location information for the integrated circuit may be of limited use, requiring substantial manual editing by a user to rearrange the circuit components into a meaningful schematic representing the integrated circuit.

To assist the user, circuit components may be placed based on port information, power information, and/or component pin connection information. This information is included in the component/logic netlist generated from the edited layout or layer information. As components are placed in the schematic, port, power, and/or component pin connection information are referenced in an organized fashion. For example, components tied to input ports may be placed on the left side of the schematic with components tied to the power rail on the top of the schematic, etc. Further, components can be gradually located from top to bottom and left to right as the component pin connections are followed from previously placed components. For example, the relative voltage potential of a component pin can be dynamically determined, and the component placed on the schematic based on the relative potential. This further assists in reducing crossing lines and generating a conventional schematic with reduced user interface.

C. Schematic Display

As discussed above, when a schematic is initially displayed, the lines representing connections between circuit components may cross one another, adding confusion to the displayed circuit. To assist a user in discerning connection paths, the schematic can be displayed without the connecting wires. A user can then selectively display the wiring information by specifying a component (upon which all wiring connections for the component are displayed) or by specifying a pin on a component (upon which the wiring connections for the selected pin are displayed). For example, a stub can be displayed at the end of each component pin/port. A user can select a stub, and the wiring for the selected stub can be displayed. In this manner, the user can relocate the circuit components based on the limited wiring information displayed until a desired arrangement is obtained. A toggle setting can alternately display all the wiring connections or no/limited wiring connections so that progress can easily be determined.

Figure 5:
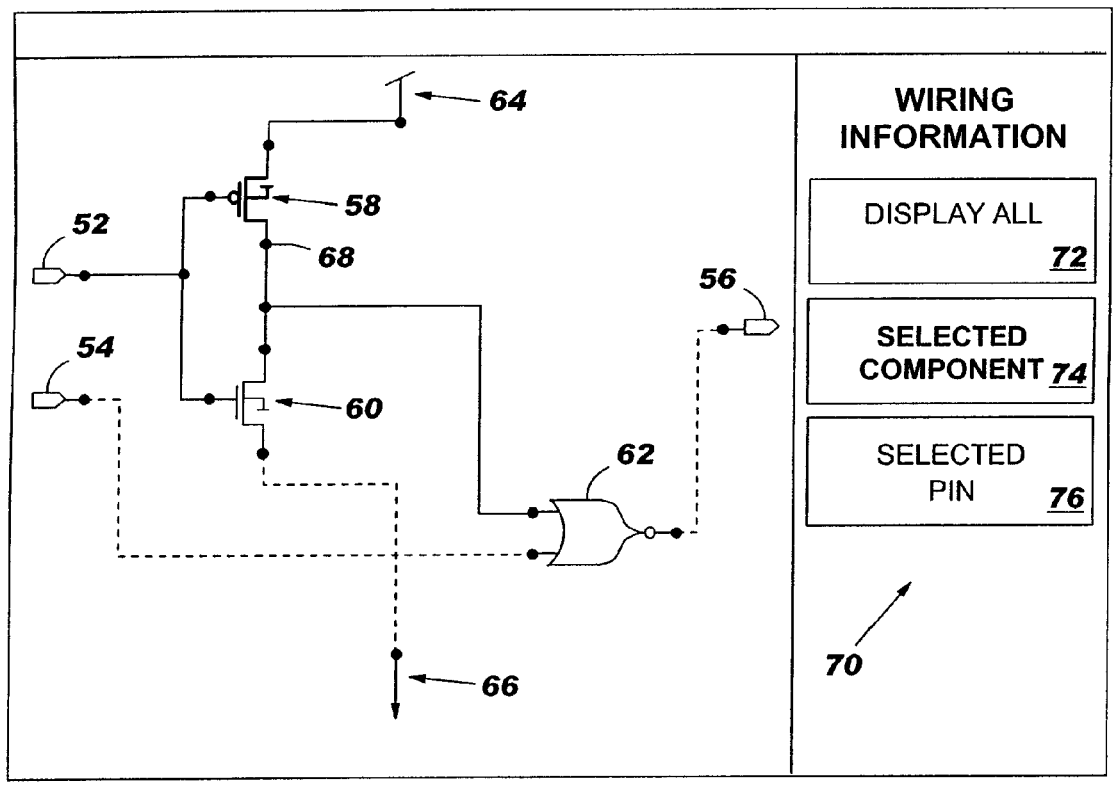
FIG. 5 depicts an illustrative schematic display.

FIG. 5 depicts an illustrative schematic display 50 according to an embodiment of the invention. Schematic display 50 includes controls 70 that allow a user to select how the wiring information of the circuit is displayed. For example, a user can select control 72 to display all wiring information, control 74 to display only wiring information of a selected component, or control 76 to display only wiring information of a selected pin. Control 74 is displayed in bold to indicate that it is the currently selected option.

The circuit includes a pair of input ports 52, 54 and an output port 56. A transistor pair 58, 60 are configured to invert the signal provided at input port 52 (perform a logical NOT). Various circuit elements have been replaced with their logical equivalent, NOR component 62. NOR component 62 performs a logical NOR operation on the output of transistor pair 58, 60 and input port 54. The output of NOR component 62 is provided to output port 56. Transistor 58 is shown in bold to indicate that it is the selected component. Consequently, only the wiring information for its pins is displayed. The remaining wiring information is shown in dashed lines, but would not be displayed based on the current selections. Each pin is shown as a stub 68. Consequently, should a user desire to display wiring information for a pin, the user would select the stub 68 that represents the pin.

As described in the previous section, the various components have been arranged according to port and power information when the schematic was generated. For example, $V_{ss}$ 64 is shown at the top of the schematic, and $V_{dd}$ 66 is located at the bottom, while input ports 52, 54 are located on the left, and output port 56 is located on the right. Further, transistors 58, 60 have been located from top to bottom according to their respective connections to $V_{ss}$ 64 and $V_{dd}$ 66. Still further, transistors 58, 60 and NOR component 62 have been located left to right according to their respective connections to input ports 52, 54 and output port 56.

It is understood that schematic display 50 is only illustrative of the capability described herein. Schematic display 50 is not intended to completely depict a schematic display or all the operations that can be performed by a user. Further, it is understood that various alternative user interfaces for indicating selections and making selections are possible, and are covered by the invention.

VII. Alternatives

While the various methods have been described as occurring in a particular sequence, it is understood that independent steps can be performed simultaneously or in a different order than that described herein. Further, it is understood that multiple iterations of one or more of the steps may be required to refine the information and increase the accuracy of the resulting netlist/schematic. Additionally, while the discussion describes the identification and diagnosis of all components on all layers of an integrated circuit, it is understood that a subset of components and/or layers can be selected and analyzed when desired.

It is understood that the invention can be realized in hardware, software, or a combination of hardware and software. Any kind of computer/server system(s)—or other apparatus adapted for carrying out the methods described herein—is suited. A typical combination of hardware and software could be a general purpose computer system with a computer program that, when loaded and executed, controls system 12, and/or a user 30 system such that they carry out the respective methods described herein. Alternatively, a specific use computer, containing specialized hardware for carrying out one or more of the functional tasks of the invention, could be utilized. The invention can also be embedded in a computer program product, which comprises all the respective features enabling the implementation of the methods described herein, and which—when loaded in a computer system—is able to carry out these methods. Computer program, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

The foregoing description of various embodiments of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of diagnosing an integrated circuit including at least one circuit layer, the method comprising the steps of:
   capturing at least one image for each of the at least one circuit layer;
   converting the at least one image into a layout;
   defining port information and power information in the layout;
   extracting component information from the layout;
   extracting net connectivity from the layout;
   generating a component netlist wherein the component netlist is based on the extracted component information and net connectivity information; and
   generating a logic netlist based on the component netlist by applying hierarchical composition rules to replace at least one circuit element in the component netlist with an equivalent logical component.

2. The method of claim 1, further comprising the step of generating a schematic based on the logic netlist.

3. The method of claim 2, wherein components of the circuit are located in the schematic based on at least one of: port information, power information, and component pin connection information.

4. The method of claim 2, further comprising displaying the schematic without wiring information.

5. The method of claim 4, further comprising displaying the wiring information of a selected component.

6. The method of claim 1, further comprising:
   providing a reference logic netlist based on a reference circuit;
   comparing the logic netlist with the reference logic netlist; and
   displaying a match between the logic netlist and the reference logic netlist.

7. A method of diagnosing an integrated circuit including at least one circuit layer, the method comprising the steps of:
   capturing at least one image of each of the at least one circuit layer;
   converting the at least one image into a layout;
   defining port information and power information in the layout;
   generating a component netlist based on the layout using an extraction engine; and
   generating a logic netlist based on the component netlist; and
   generating a schematic based on the logic netlist, wherein circuit components are located in the schematic based on at least one of: port information, power information, and component pin connection information.

8. The method of claim 7, further comprising the step of displaying the schematic without wiring information.

9. The method of claim 8, further comprising the step of displaying the wiring information of a selected circuit component.

10. An integrated circuit diagnosing system, comprising:
    a capture system that captures at least one image for each circuit layer of an integrated circuit;
    a component system that converts the at least one image into a layout, defines port information and power information in the layout, extracts component information from the layout, extracts net connectivity from the layout and generates a component netlist based on the extracted component information and net connectivity information; and
    a logic system that generates a logic netlist based on the component netlist by applying hierarchical composition rules to replace at least one circuit element in the component netlist with an equivalent logical component.

11. The system of claim 10, further comprising a compare system that compares at least one of the logic netlist and the component netlist with a reference netlist based on a reference circuit.

12. The system of claim 10, further comprising a schematic system that generates a schematic based on at least one of the logic netlist and the component netlist.

13. The system of claim 12, further comprising a display system that selectively displays wiring information in the schematic.

14. A computer program product comprising a computer storage device having computer readable program code embodied therein for diagnosing an integrated circuit, the program product comprising:

program code configured to convert at least one image into a layout;

program code configured to define port information and power information in the layout;

program code configured to extract component information from the layout;

program code configured to extract net connectivity from the layout;

program code configured to generate a component netlist based on the extracted component information and net connectivity information for each circuit layer of the integrated circuit; and program code configured to generate a logic netlist based on the component netlist by applying hierarchical composition rules to replace at least one circuit element in the component netlist with an equivalent logical component.

15. The computer program product of claim 14, further comprising program code configured to compare at least one of the logic netlist and the component netlist with a reference netlist based on a reference circuit.

16. The computer program product of claim 14, further comprising program code configured to generate a schematic based on at least one of the logic netlist and the component netlist.

17. The computer program product of claim 16, further comprising program code configured to selectively display wiring information in the schematic.

* * * * *